(12) United States Patent
Sun

(10) Patent No.: US 8,437,123 B2
(45) Date of Patent: May 7, 2013

(54) SERVER CABINET AND SERVER SYSTEM WITH SAME

(75) Inventor: Zheng-Heng Sun, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 216 days.

(21) Appl. No.: 12/967,049

(22) Filed: Dec. 14, 2010

(65) Prior Publication Data

US 2011/0279956 A1    Nov. 17, 2011

(30) Foreign Application Priority Data

May 11, 2010    (CN) .......................... 2010 1 0168849

(51) Int. Cl.
*G06F 1/16* (2006.01)
*A47B 88/16* (2006.01)
*A47B 88/04* (2006.01)
*H05K 5/02* (2006.01)

(52) U.S. Cl.
USPC ............ 361/679.02; 361/679.01; 361/679.15; 361/679.16; 361/679.2; 361/679.07; 312/334.4; 312/334.5; 312/334.7; 312/334.8; 312/311

(58) Field of Classification Search ............ 361/679.02; 312/223.1, 334.7, 334.12, 334.21, 349, 350, 312/312/330.1, 322, 309–311, 317.1–317.3, 312/318, 308, 301–303, 273–276, 21–26
See application file for complete search history.

(56) References Cited

U.S. PATENT DOCUMENTS

| 5,877,936 | A | * | 3/1999 | Nishitani et al. ............... 361/600 |
| 5,947,035 | A | * | 9/1999 | Chang .............................. 108/94 |
| 6,068,356 | A | * | 5/2000 | Giuseppe ....................... 312/290 |
| 2008/0012456 | A1 | * | 1/2008 | Judge et al. ................ 312/334.1 |

* cited by examiner

*Primary Examiner* — Tuan T Dinh
*Assistant Examiner* — Mukund G Patel
(74) *Attorney, Agent, or Firm* — Altis Law Group, Inc.

(57) ABSTRACT

A server cabinet includes a cabinet, a first slide rail, and a second slide rail. The cabinet includes a top surface, a bottom surface, a rear wall, two sidewalls, and two doors. The first slide rail is mounted on an inner surface of one of the sidewalls. The first slide rail has a first end and an opposite second end. The first slide rail defines a first slide groove. The first end is adjacent to the doors, and the second end is close to the rear wall. The second slide rail has a first and a second connection ends. The second slide rail defines a second slide groove. The first connection end is rotatably coupled to the first end so that the second slide rail is capable of rotating relative to the first slide rail to a position where the second slide rail aligns with the first slide rail.

18 Claims, 8 Drawing Sheets

SERVER CABINET AND SERVER SYSTEM WITH SAME

BACKGROUND

1. Technical Field

The present disclosure relates to a server cabinet and a server system with the server cabinet.

2. Description of Related Art

A commonly used server system includes a server cabinet and a server received in the server cabinet. However, it can be inconvenient to install the server in the server cabinet.

Therefore, it is desirable to provide a server cabinet and a server system which can overcome the described limitations.

DETAILED DESCRIPTION

Figure 1:
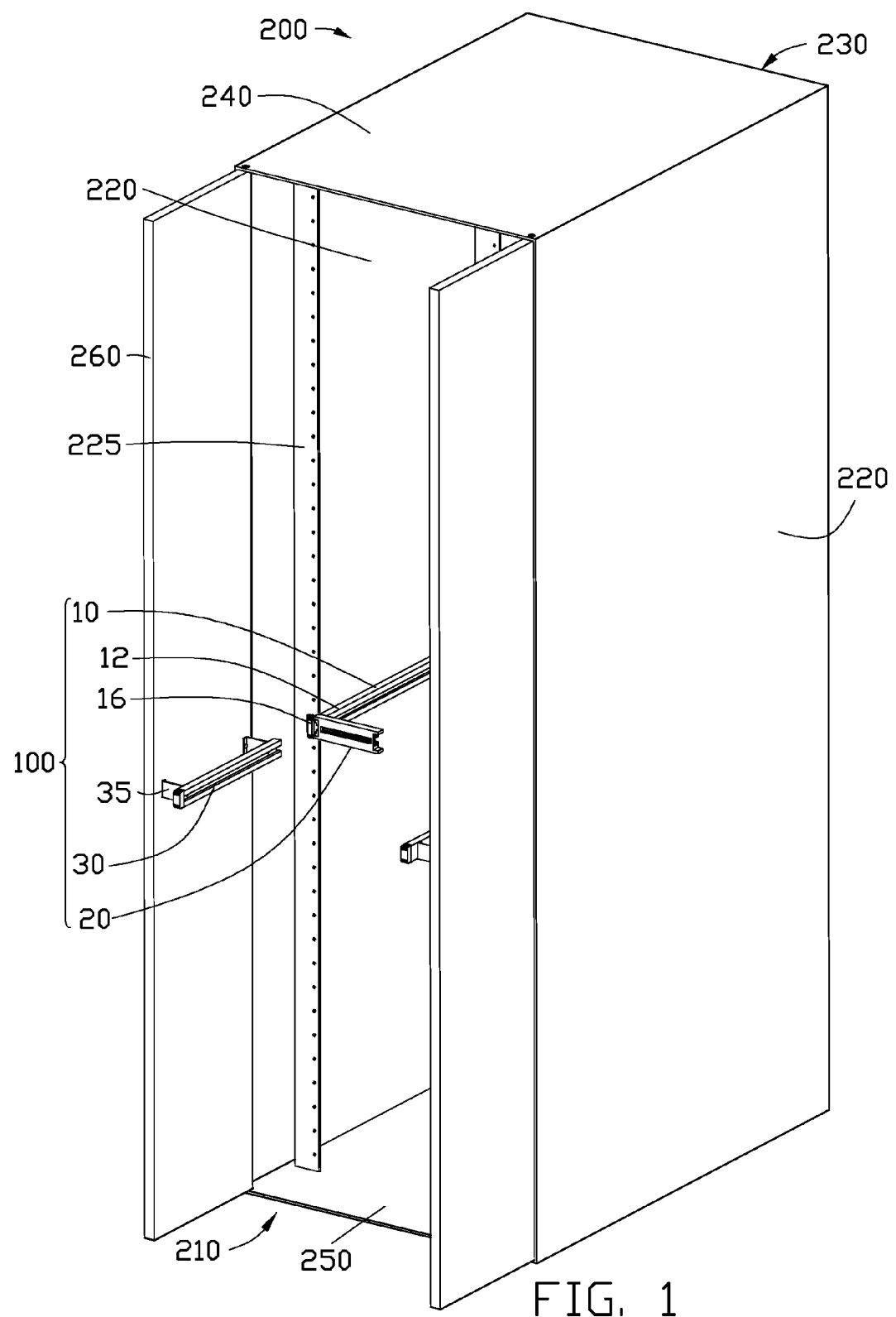
FIG. 1 is a perspective view of a server cabinet according to an embodiment.

Referring to FIG. 1, an embodiment of a server cabinet 200 includes two opposite sidewalls 220, a rear wall 230, a top surface 240, a bottom surface 250, two doors 260, and a slide rail assembly 100. The sidewalls 220, the rear wall 230, the top surface 240, and the bottom surface 250 cooperatively define an accommodating space 210. The doors 260 are hinged on the top surface 240 and the bottom surface 250 and open or close to provide or limit access to the accommodating space 210.

The sidewalls 220 each have a bracket 225 for fixing the slide rail assembly 100.

Figure 2:
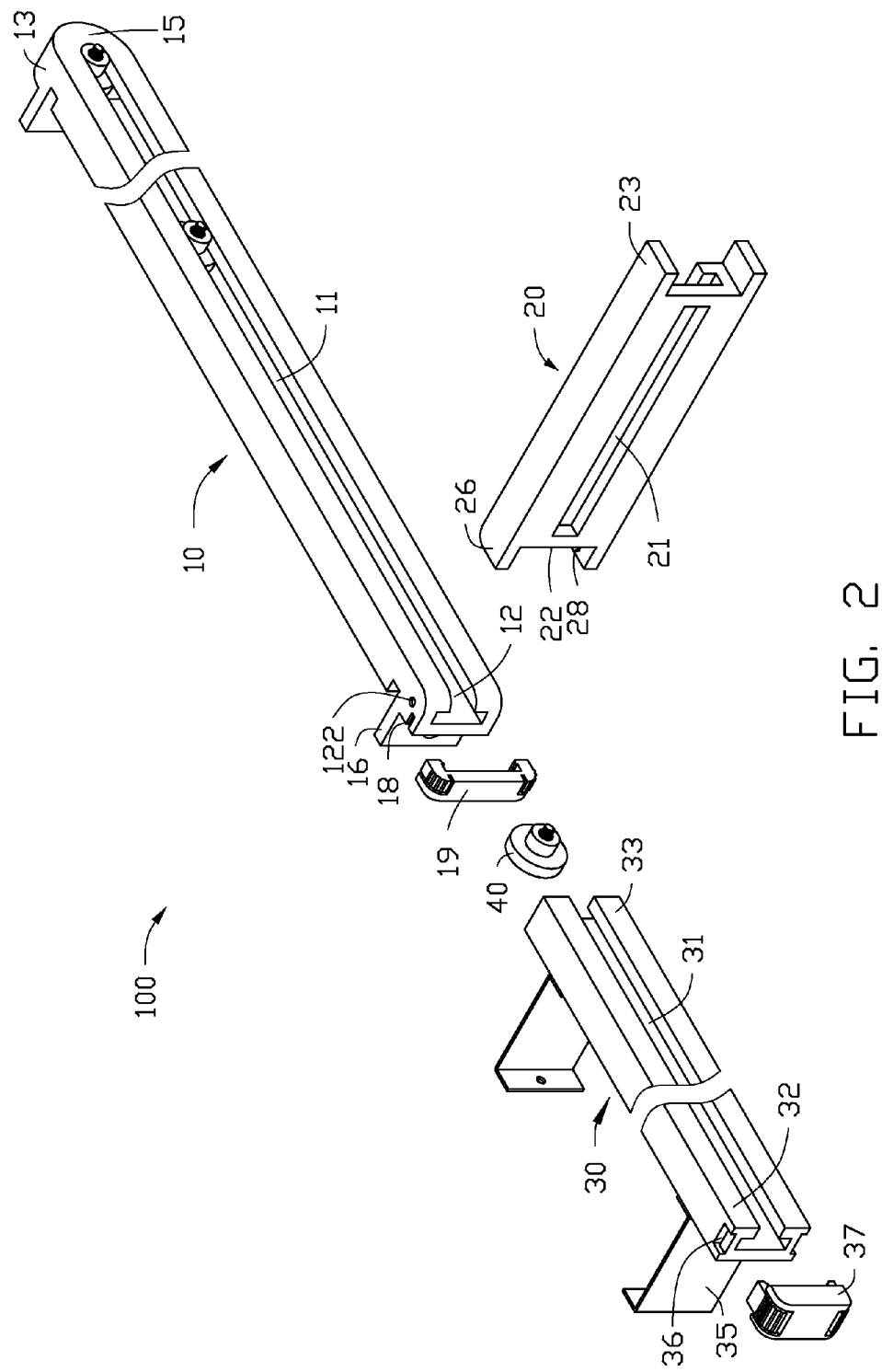
FIG. 2 is an exploded view of a slide rail assembly (only a first slide rail, a second slide rail, and a third slide rail are shown) of the server cabinet of FIG. 1.
Figure 3:
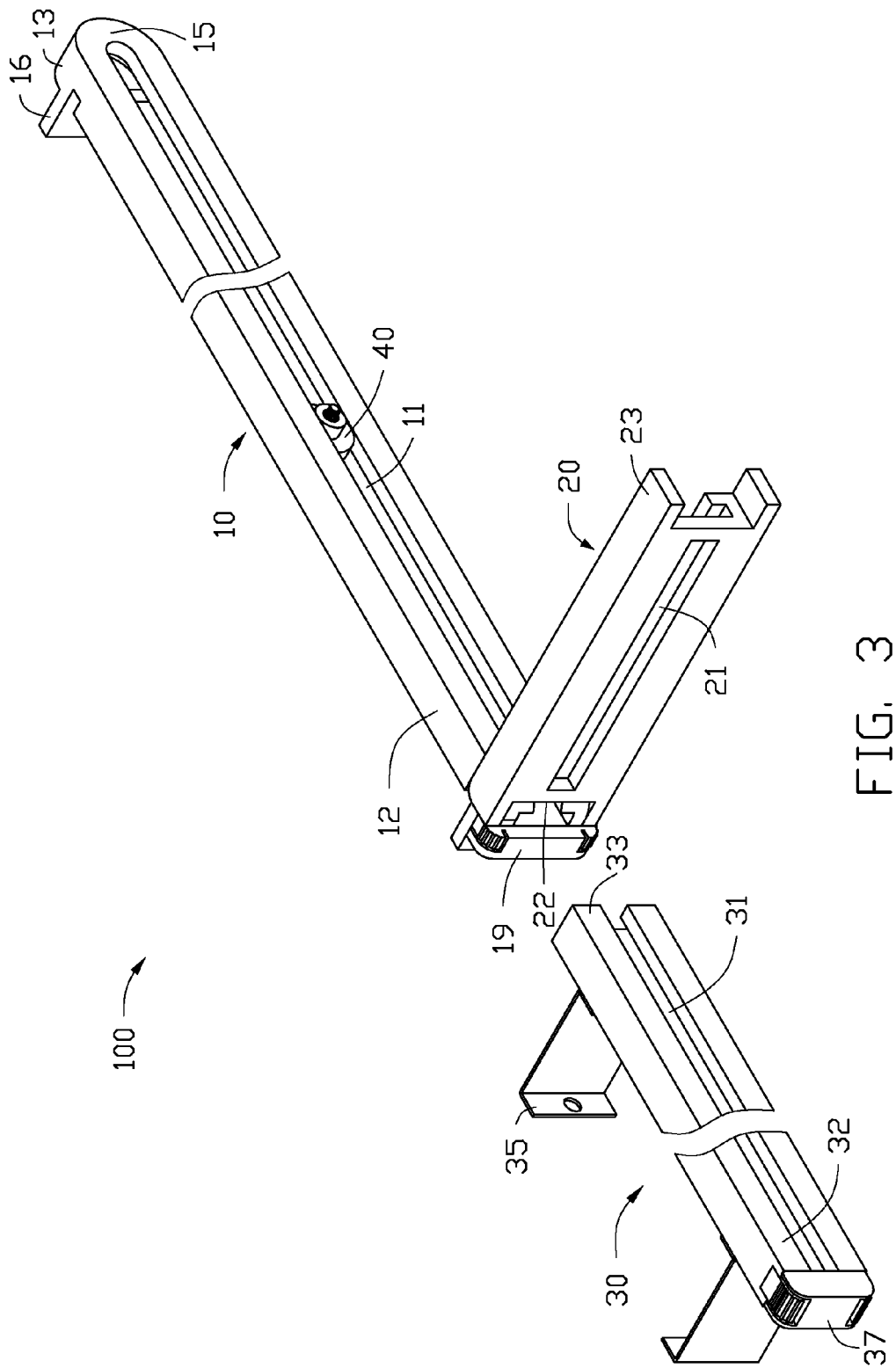
FIG. 3 is an assembled isometric view of the slide rail assembly of FIG. 2.
Figure 4:
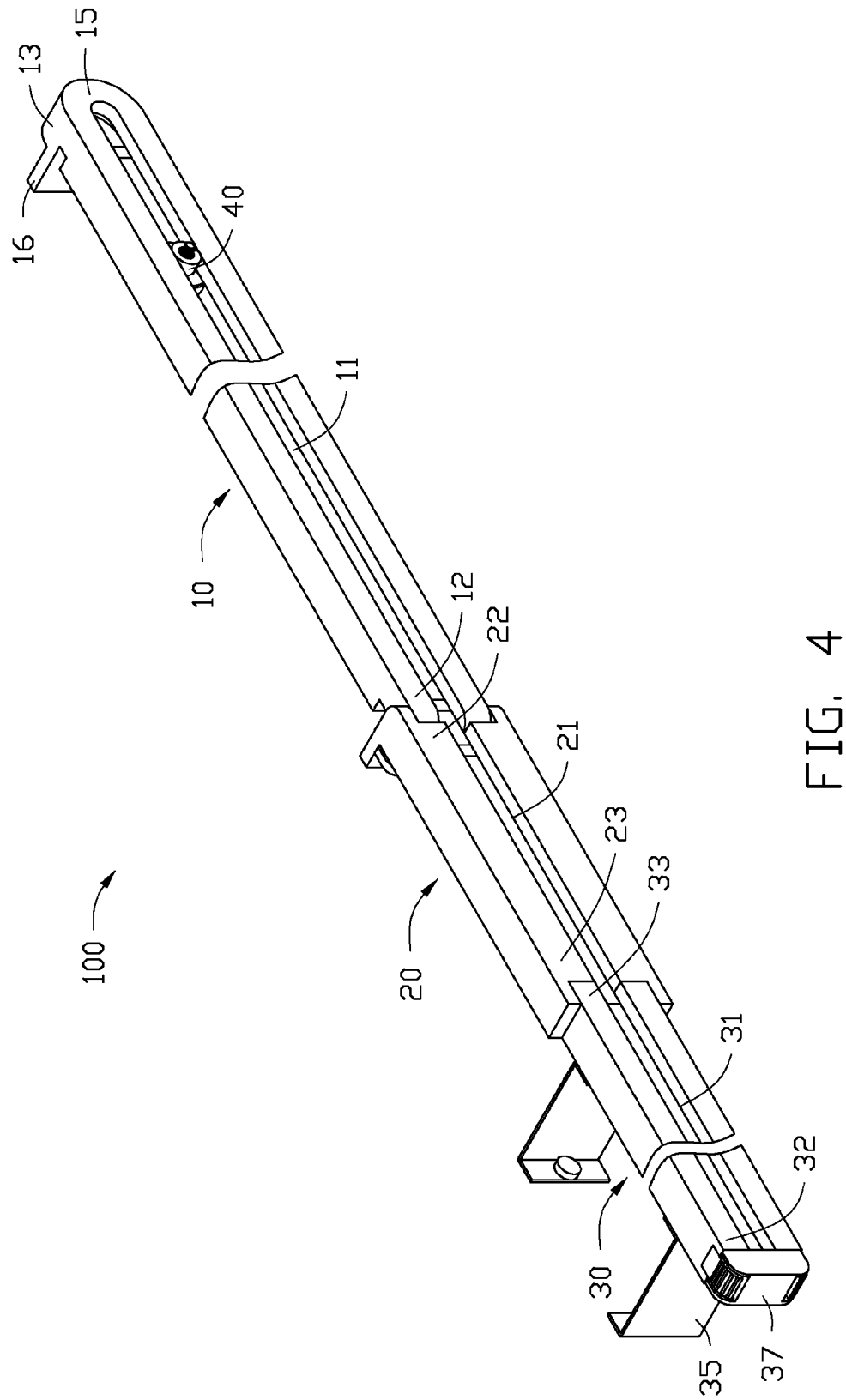
FIG. 4 is a perspective view of the slide rail assembly of FIG. 2 in working state.

Also referring to FIGS. 2-4, the slide rail assembly 100 includes a pair of first slide rails 10, a pair of second slide rails 20, and a pair of third slide rails 30. The first slide rails 10, the second slide rails 20, and the third slide rails 30 are linear, and receive rollers 40.

The first slide rail 10 includes a first end 12, an opposite second end 13, and defines a slide groove 11. The first end 12 defines two connection holes 122 at two opposite sides of the first slide groove 11. The rollers 40 slide along the first slide groove 11.

The second end 13 includes a stopper 15 for preventing the rollers 40 from sliding out of the first slide groove 11.

The first slide rail 10 further includes two support parts 16 facing away from the first slide groove 11, and defines a fixing groove 18. The two support parts 16 are arranged at the first end 12 and the second end 13 respectively, and for assembling the first slide rail to the sidewall 220. The fixing groove 18 is configured for coupling with an endplate 19. The endplate 19 limits rotation of the second slide rail 20 relative to the first slide rail 10.

The second slide rail 20 includes a first connection end 22, a second connection end 23, and a second slide groove 21 defined therein. The rollers 40 slide along the second slide groove 21. The first connection end 22 includes two protrusions 26 extending from two sides of the second slide groove 21 along a longitudinal axis of the second slide rail 20. Each protrusion 26 has a connection shaft 28 formed thereon. Each connection shaft 28 is received in a respective connection hole 122 so that the first slide rail 10 is rotatable around the connection shaft 28 relative to the second slide rail 20. When the second slide rail 20 rotates to a position aligning with the first slide rail 10, the second slide groove 21 aligns and communicates with the first slide groove 11, allowing the rollers 40 to slide from the first slide groove 11 to the second slide groove 21.

A width of the first slide groove 11 is substantially equal to that of the second slide groove 21. The width of the first slide groove 11 exceeds a diameter of the roller 40.

When the second slide rail 20 rotates to a position in which the second slide rail 20 is substantially perpendicular to the first slide rail 10, the endplate 19 is coupled to the fixing groove 18, fixing the second slide rail 20 in position.

The third slide rail 30 includes a guide end 32 and a third connection end 33, a third slide groove 31 defined therein, and two support parts 35. The rollers 40 can slide along the slide groove 31. The two support parts 35 are arranged on a side of the third slide rail 30 facing away from the third slide groove 31. The third slide rail 30 is fixed on an inner surface of the door 260 via the support parts 35.

When the door 260 is hinged open to a position in which the third slide rail 30 aligns with the first slide rail 10, a distance between the first end 12 and the third connection end 33 is substantially equal to a length of the second slide rail 20. When the third slide rail 30 is in this position and the second slide rail 20 is rotated to align with the first slide rail 10, the second slide rail 20 connects the first slide rail 10 and the third slide rail 30 as a bridge so that the first slide groove 11 communicates with the second slide groove 21 and the third slide groove 31. In this way, the rollers 40 can slide along the first, the second, and the third slide grooves 11, 21, 31.

The third slide rail 30 further defines a fixing groove 36 at the guide end 32. The fixing groove 36 is received in a endplate 37, thus preventing the rollers 40 from sliding out of the third slide groove 31 via the guide end 32.

In the present embodiment, the first, the second, and the third slide grooves 11, 21, 31 are T-shaped in cross-section.

The first slide rail 10 is fixed on an inner surface of the sidewall 220 by the support part 16 and the bracket 225. The first end 12 is adjacent to the doors 260, and the second end 13 is next to the rear wall 230.

The two first slide rails 10 are mounted on corresponding sidewalls 220 in a face-to-face fashion.

The third slide rails 30 are mounted on a respective inner surface of the door 260 face to face. A height of the third slide rail 30 relative to the bottom surface 250 is substantially equal to that of the first slide rail 10 from the bottom surface 250. The third connection end 33 is adjacent to a rotation axis (not labeled) of the door 260. The guide end 32 is separated from the rotation axis of the door 260.

FIGS. 5-8 show installation of a server 280 into the server cabinet 200. The server 280 includes a number of rollers 40 arranged on two opposite sides.

Figure 5:
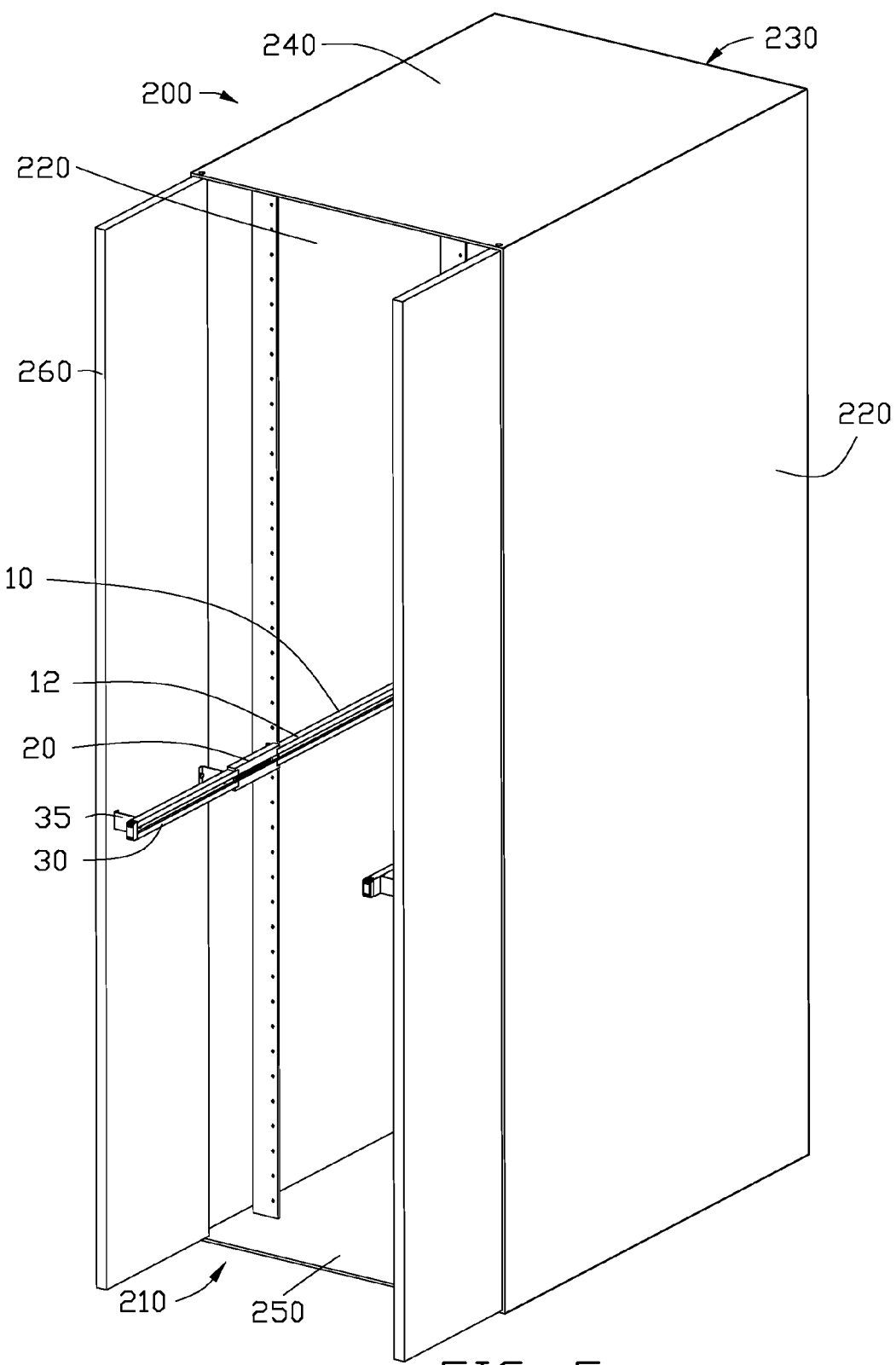
FIGS. 5-8 show successive stages of installation of a server in the server cabinet of FIG. 1.

Referring to FIG. 5, the second slide rail 20 is rotated to align with the first slide rail 10, and then the door 260 is rotated to a position that the third slide rail 30 is collinear with the second slide rail 20.

Figure 6:
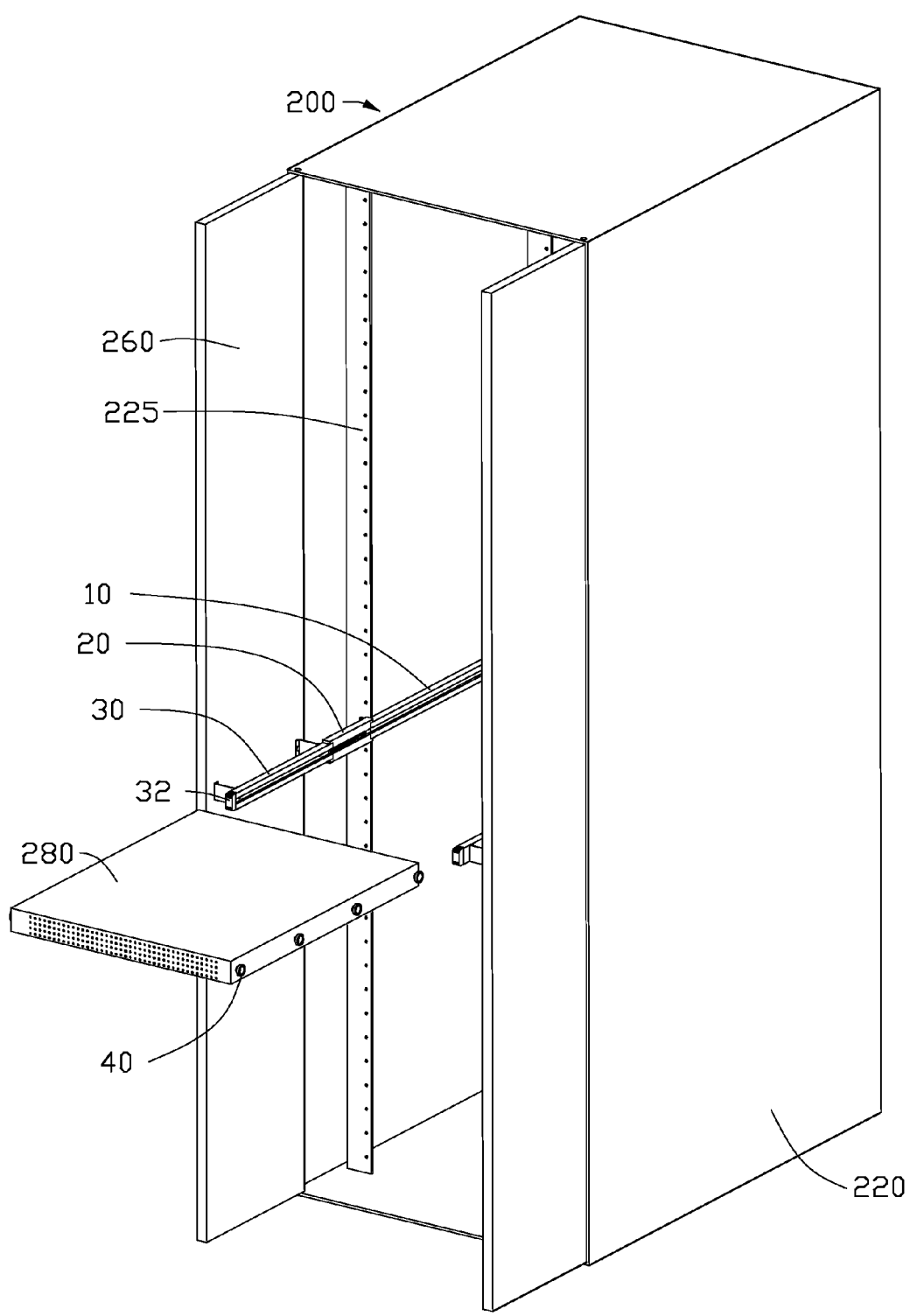
Figure 7:
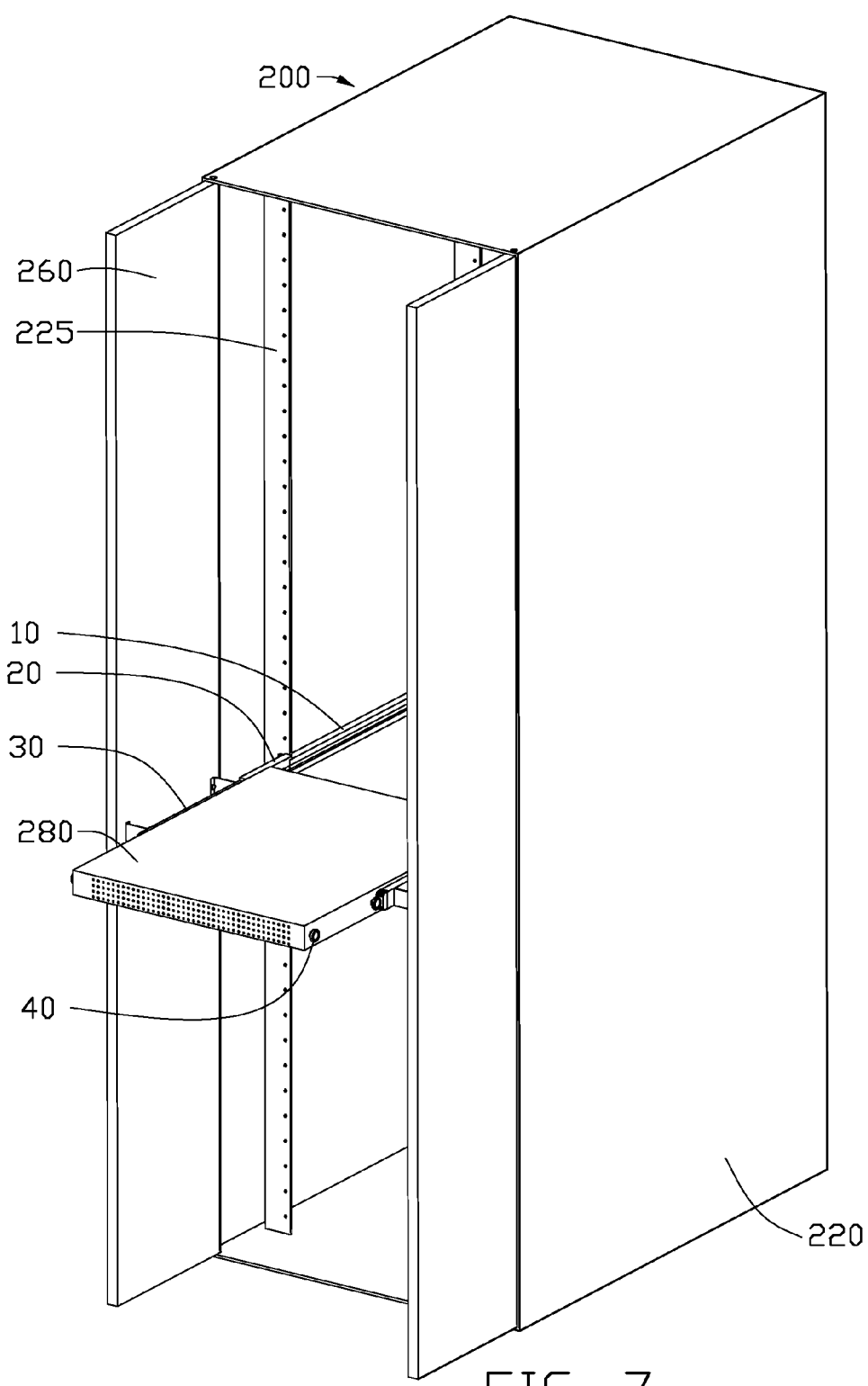

Referring to FIGS. 6-7, the server 280 is moved into the cabinet in such a manner that the rollers 40 slide along the third slide groove 31, the second slide groove 21, and the first slide groove 11 until the rollers 40 reach the end of the first slide groove 11.

Figure 8:
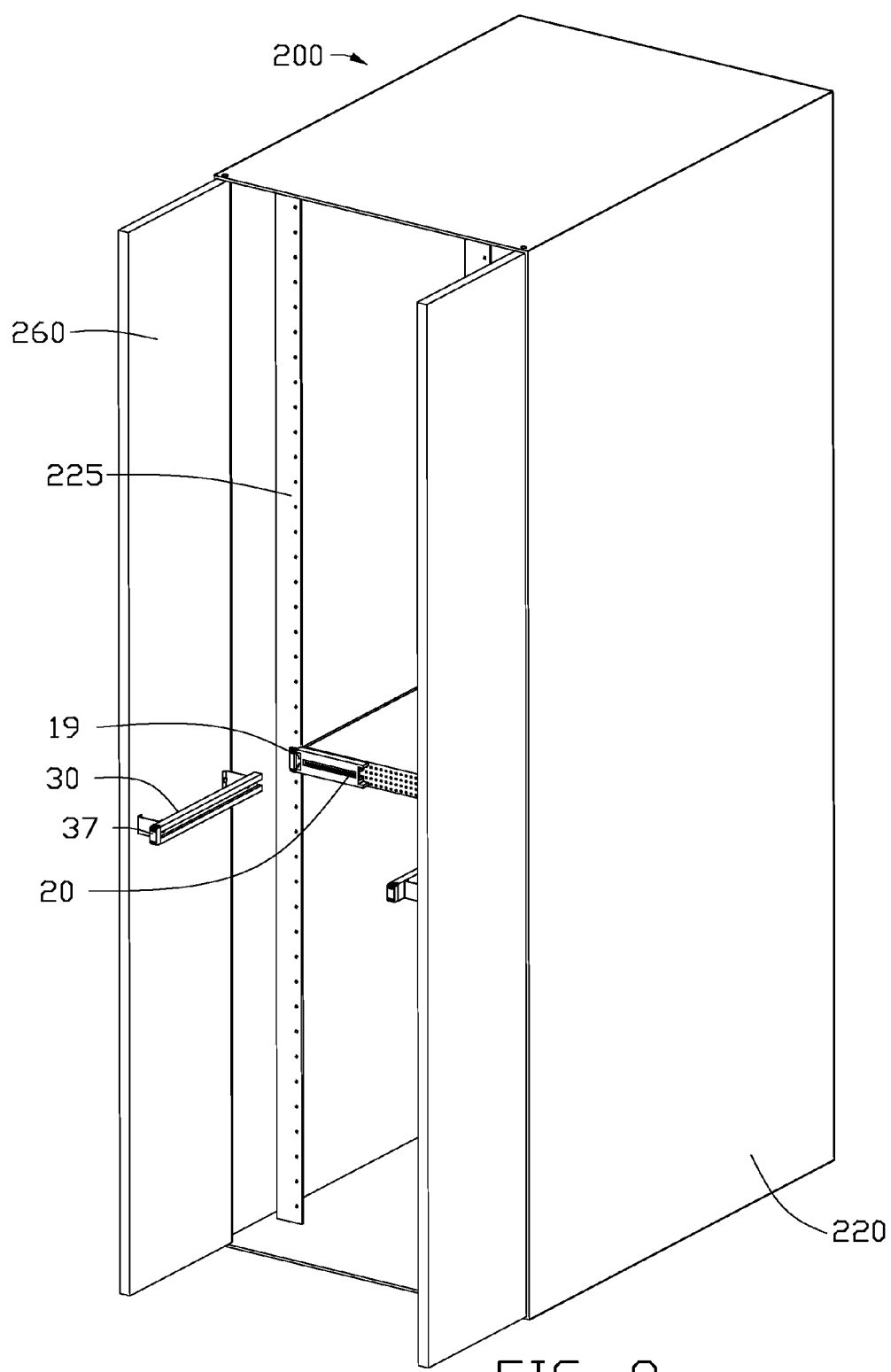

Referring to FIG. 8, after the server 280 is assembled in place, the second slide rail 20 is rotated towards the server 280, and then the endplate 19 is applied to the fixing groove 18, thus limiting the position of the second slide rail 20. Finally, the doors 260 are closed, protecting the interior from contaminants and pollution. The server 280 and the server cabinet 200 cooperatively form a server system.

While various embodiments have been described, it is to be understood that the disclosure is not limited thereto. To the contrary, various modifications and similar arrangements (as would be apparent to those skilled in the art), are also intended to be covered. Therefore, the scope of the appended claims should be accorded the broadest interpretation so as to encompass all such modifications and similar arrangements.

What is claimed is:

1. A server cabinet, comprising:
   a cabinet comprising a top surface, a bottom surface, a rear wall, and two sidewalls;
   a first slide rail mounted on an inner surface of one of the sidewalls, the first slide rail having a first end and an opposite second end, the first slide rail defining a first slide groove, the first end defining two connection holes, and the second end close to the rear wall; and
   a second slide rail having a first connection end and an opposite second connection end, the second slide rail defining a second slide groove, the first connection end comprising two connection shafts, the first end of the first slide rail being rotatably connected to the first connection end by the two connection shafts pivotally inserting into the two connection holes;
   wherein the first slide rail and the second slide rail are configured for receiving a plurality of rollers, and the second slide rail is capable of rotating relative to the first slide rail to a position where the second slide rail aligns with the first slide rail and the second slide groove communicates with the first slide groove to allow the rollers to slide from the first slide groove to the second slide groove or from the second slide groove to the first slide groove.

2. The server cabinet of claim 1, further comprising an endplate, wherein the first end further defines a fixing groove, the endplate is received in the fixing groove, and the endplate is configured for limiting the second slide rail in a position where the second slide rail is substantially perpendicular to the first slide rail.

3. The server cabinet of claim 1, further comprising two doors and a third slide rail, wherein the two doors are pivotally coupled to the top surface and the bottom surface, the third slide rail is fixed on an inner surface of one of the doors, each of the doors is capable of rotating to a position where the third slide rail aligns with the first slide rail, and a distance between the third slide rail and the first slide rail is substantially equal to a length of the second slide rail.

4. The server cabinet of claim 3, wherein the third slide rail defines a third slide groove, and the third slide groove is selectively aligned with both the first and the second slide grooves.

5. The server cabinet of claim 4, wherein the third slide groove is T-shaped in cross-section.

6. The server cabinet of claim 5, wherein the third slide rail further comprises two support parts facing away from the third slide groove, and the third slide rail is mounted on one of the doors via the two support parts.

7. The server cabinet of claim 1, wherein the first slide groove and the second slide groove are T-shaped in cross-section.

8. The server cabinet of claim 1, wherein the first slide rail further comprises two support parts facing away from the first slide groove, and the first slide rail is mounted on the sidewall via the two support parts.

9. The server cabinet of claim 1, wherein the sidewall comprises a bracket for mounting the first slide rail thereon.

10. A server system comprising:
    a server having a plurality of rollers on two opposite sides; and
    a server cabinet comprising:
       a cabinet comprising a top surface, a bottom surface, a rear wall, and two sidewalls;
       a first slide rail mounted on an inner surface of one of the sidewalls, the first slide rail having a first end and an opposite second end, the first slide rail defining a first slide groove, the first end defining two connection holes, and the second end close to the rear wall; and
       a second slide rail having a first connection end and a second connection end, the second slide rail defining a second slide groove, the first connection end comprising two connection shafts, the first end of the first slide rail being rotatably connected to the first connection end by the two connection shafts pivotally inserting into the two connection holes;
    wherein the second slide rail is capable of rotating relative to the first slide rail to a position where the second slide rail aligns with the first slide rail and the second slide groove communicates with the first slide groove, to allow the rollers to slide from the first slide groove to the second slide groove or from the second slide groove to the first slide groove.

11. The server system of claim 10, wherein the server cabinet further comprises an endplate, the first end defines a fixing groove, the endplate is received in the fixing groove, and the endplate is configured for limiting the second slide rail in a position where the second slide rail is substantially perpendicular to the first slide rail.

12. The server system of claim 10, wherein the server cabinet further comprises two doors and a third slide rail, the two doors are pivotally coupled to the top surface and the bottom surface, the third slide rail is fixed on an inner surface of one of the doors, each of the doors is capable of rotating to a position where the third slide rail aligns with the first slide rail, and a distance between the third slide rail and the first slide rail is substantially equal to a length of the second slide rail.

13. The server system of claim 12, wherein the third slide rail defines a third slide groove, and the third slide groove is selectively aligned with both the first and the second slide grooves.

14. The server system of claim 13, wherein the third slide groove is T-shaped in cross-section.

15. The server system of claim 13, wherein the third slide rail further comprises two support parts facing away from the third slide groove, and the third slide rail is mounted on one of the doors via the two support parts.

16. The server system of claim 10, wherein the first slide groove and the second slide groove are T-shaped in cross-section.

17. The server system of claim 10, wherein the first slide rail further comprises two support parts facing away from the first slide groove, and the first slide rail is mounted on the sidewall via the two support parts.

18. The server system of claim 10, wherein the sidewall comprises a bracket for mounting the first slide rail thereon.

* * * * *